US 11,963,296 B2

(12) United States Patent
Chang et al.

(10) Patent No.: US 11,963,296 B2
(45) Date of Patent: Apr. 16, 2024

(54) CAVITY PRINTED CIRCUIT BOARD FOR THREE-DIMENSIONAL IC PACKAGE

(71) Applicant: Google LLC, Mountain View, CA (US)

(72) Inventors: Yuan Jen Chang, Taipei (TW); Ronald Trinidad, New Taipei (TW)

(73) Assignee: Google LLC, Mountain View, CA (US)

( * ) Notice: Subject to any disclaimer, the term of this patent is extended or adjusted under 35 U.S.C. 154(b) by 0 days.

(21) Appl. No.: 17/551,513

(22) Filed: Dec. 15, 2021

(65) Prior Publication Data

US 2023/0114118 A1 Apr. 13, 2023

Related U.S. Application Data

(60) Provisional application No. 63/253,302, filed on Oct. 7, 2021.

(51) Int. Cl.
| | | |
|---|---|---|
| *H05K 1/02* | (2006.01) | |
| *H01L 25/065* | (2023.01) | |
| *H01L 27/06* | (2006.01) | |
| *H05K 1/11* | (2006.01) | |
| *H05K 3/46* | (2006.01) | |

(52) U.S. Cl.
CPC ....... *H05K 1/0284* (2013.01); *H01L 25/0652* (2013.01); *H01L 27/0688* (2013.01); *H05K 1/113* (2013.01); *H05K 3/4697* (2013.01)

(58) Field of Classification Search
CPC .... H05K 1/0284; H05K 1/113; H05K 3/4697; H01L 25/0652
USPC ......................................................... 361/772
See application file for complete search history.

(56) References Cited

U.S. PATENT DOCUMENTS

| | | | |
|---|---|---|---|
| 10,555,424 B1* | 2/2020 | Wu | H05K 1/113 |
| 2006/0097370 A1* | 5/2006 | Bartley | H01L 23/49838 |
| | | | 257/E23.07 |
| 2006/0133043 A1 | 6/2006 | Boudreaux et al. | |
| 2011/0024899 A1* | 2/2011 | Masumoto | H01L 25/105 |
| | | | 257/E21.705 |
| 2011/0210436 A1 | 9/2011 | Chow et al. | |

(Continued)

FOREIGN PATENT DOCUMENTS

| | | |
|---|---|---|
| EP | 3869924 | 8/2021 |
| WO | 2011099820 A2 | 8/2011 |

OTHER PUBLICATIONS

Pcbcart. PCB Manufacturing Process—A Step-by-Step Guide. Retrieved on Jul. 12, 2021. Retrieved from the Internet: <https://www.pcbcart.com/article/content/PCB-manufacturing-process.html>. 8 pages.

(Continued)

*Primary Examiner* — Andargie M Aychillhum
(74) *Attorney, Agent, or Firm* — Colby Nipper PLLC

(57) ABSTRACT

A cavity printed circuit board (PCB) that allows electronic components with different dimensions disposed therein is provided. A cavity with a desired dimension is formed in the cavity PCB where the electronic components may be mounted and soldered therein. The cavity formed in the cavity PCB may also provide additional flexibility regarding placements and locations where the electronic components may be disposed in the 3D vertical stacking and packaging of the IC devices so as to provide alternatives of using different types of wiring or interconnection structures or fine-pitch connection lines among the electronic components.

12 Claims, 17 Drawing Sheets

(56) References Cited

U.S. PATENT DOCUMENTS

| | | | |
|---|---|---|---|
| 2013/0044431 A1* | 2/2013 | Koeneman | H01L 25/0657 |
| | | | 361/699 |
| 2013/0083494 A1 | 4/2013 | Syal et al. | |
| 2013/0199829 A1 | 8/2013 | Gottwald | |
| 2014/0263585 A1 | 9/2014 | Sweere | |
| 2015/0110496 A1* | 4/2015 | DeCusatis | G02B 6/00 |
| | | | 398/116 |
| 2015/0235915 A1* | 8/2015 | Liang | H01L 25/0652 |
| | | | 361/764 |
| 2015/0255434 A1 | 9/2015 | Yazdani | |
| 2023/0413440 A1 | 12/2023 | Lai et al. | |

OTHER PUBLICATIONS

San Francisco Circuits Inc. The Importance of PCB Trace Widths in PCB Design. Retrieved on Jul. 12, 2021. Retrieved from the Internet: <https://www.sfcircuits.com/pcb-school/pcb-trace-widths>. 9 pages.

"The Power of Endicott Interconnect's 3D Packaging Solutions", http://i3electronics.com/2016/11/21/the-power-of-endicott-interconnects-3d-packaging-solutions/ accessed Aug. 9, 2019, Nov. 21, 2016, 3 pages.

Ghajar, et al., "The Use of Discontiguous Interposers to Stack Multiple Printed Circuit Boards Circuit Boards", Technical Disclosure Commons, https://www.tdcommons.org/dpubs_series/2597, Oct. 2019, 9 pages.

* cited by examiner

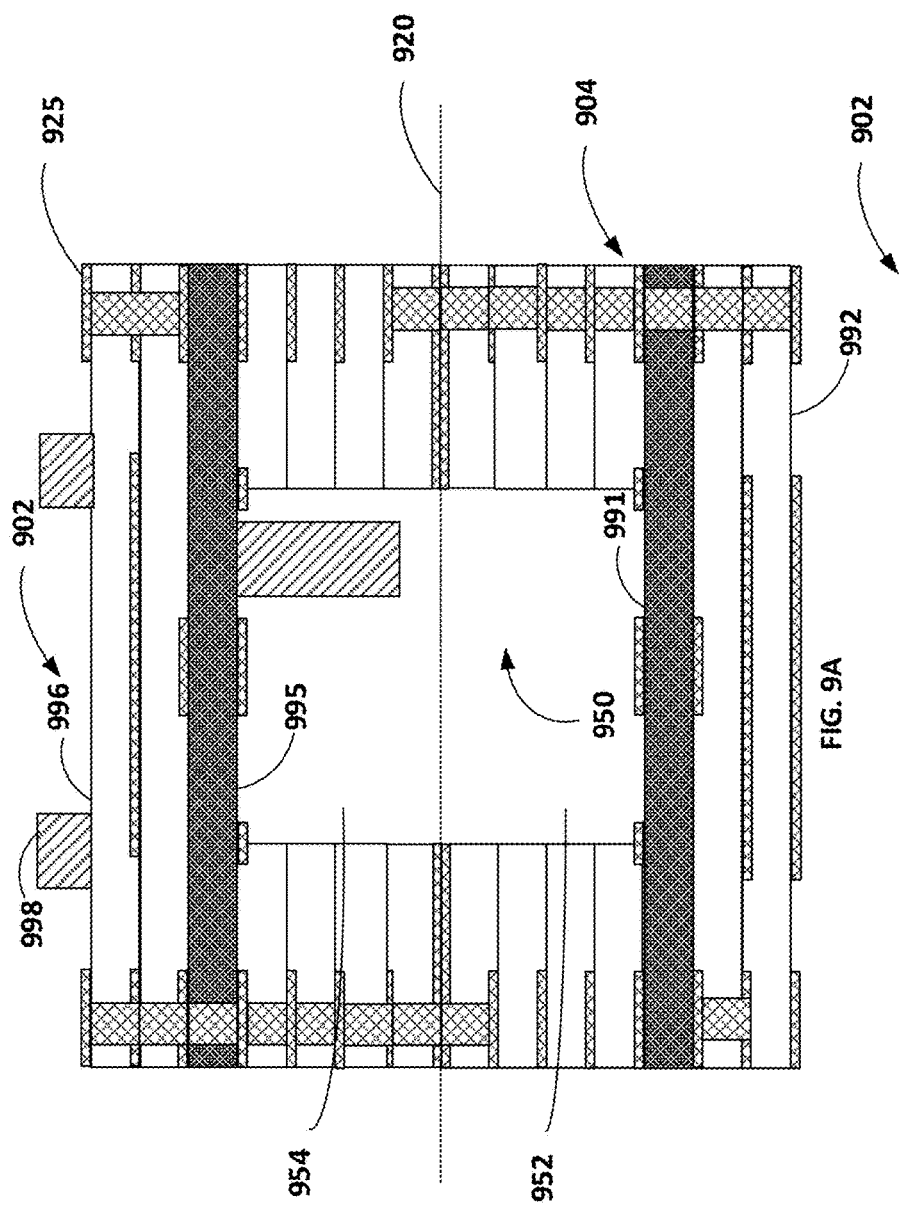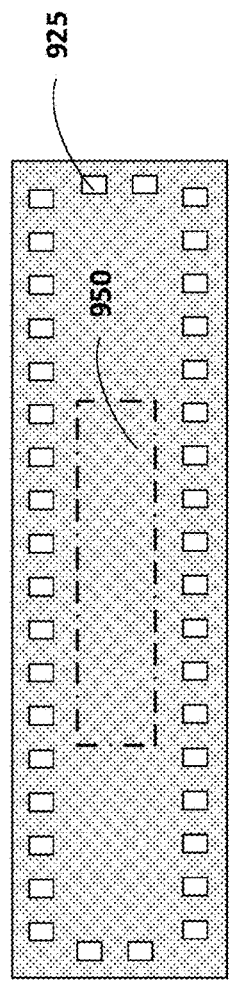
FIG. 9A
FIG. 9B

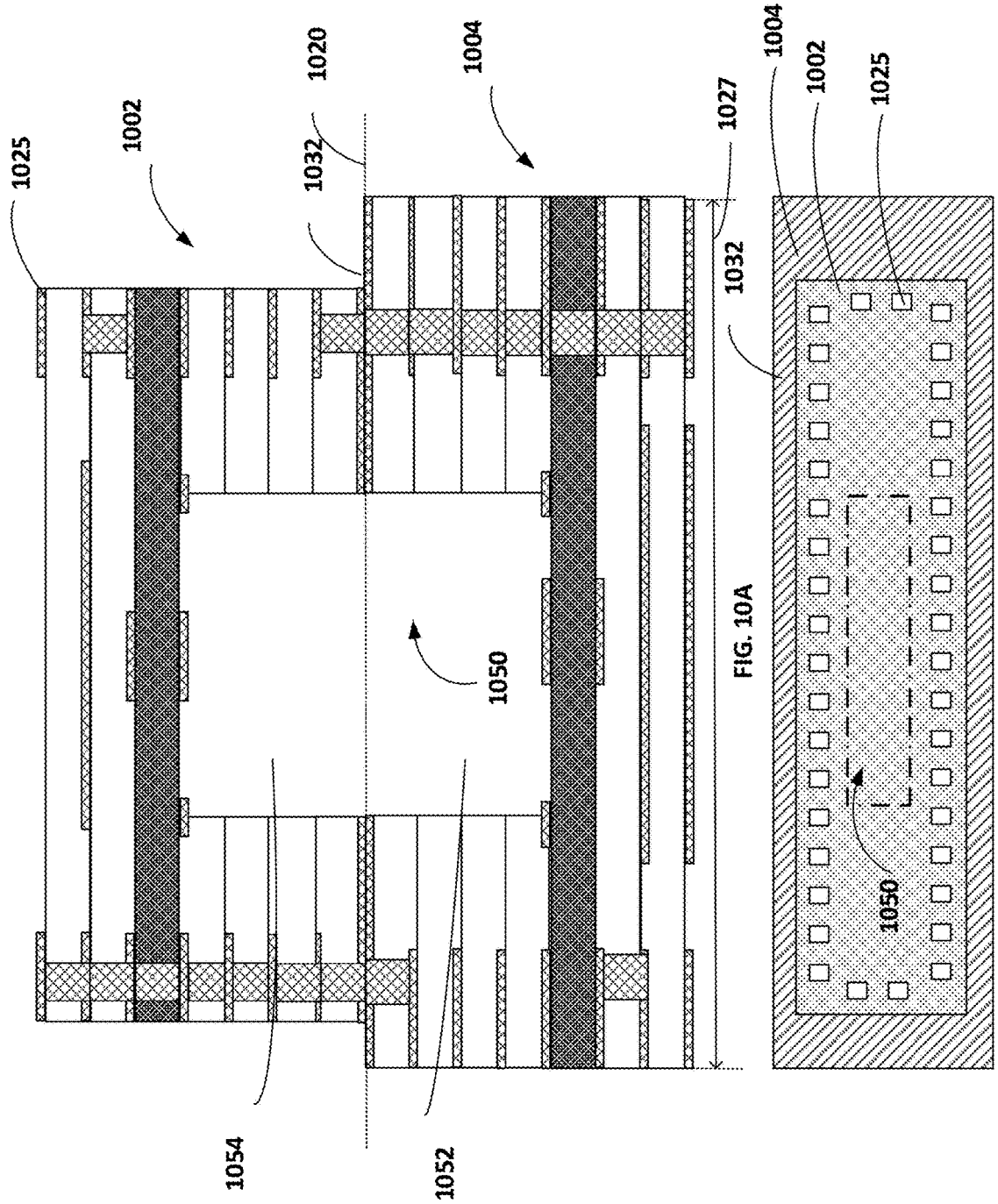

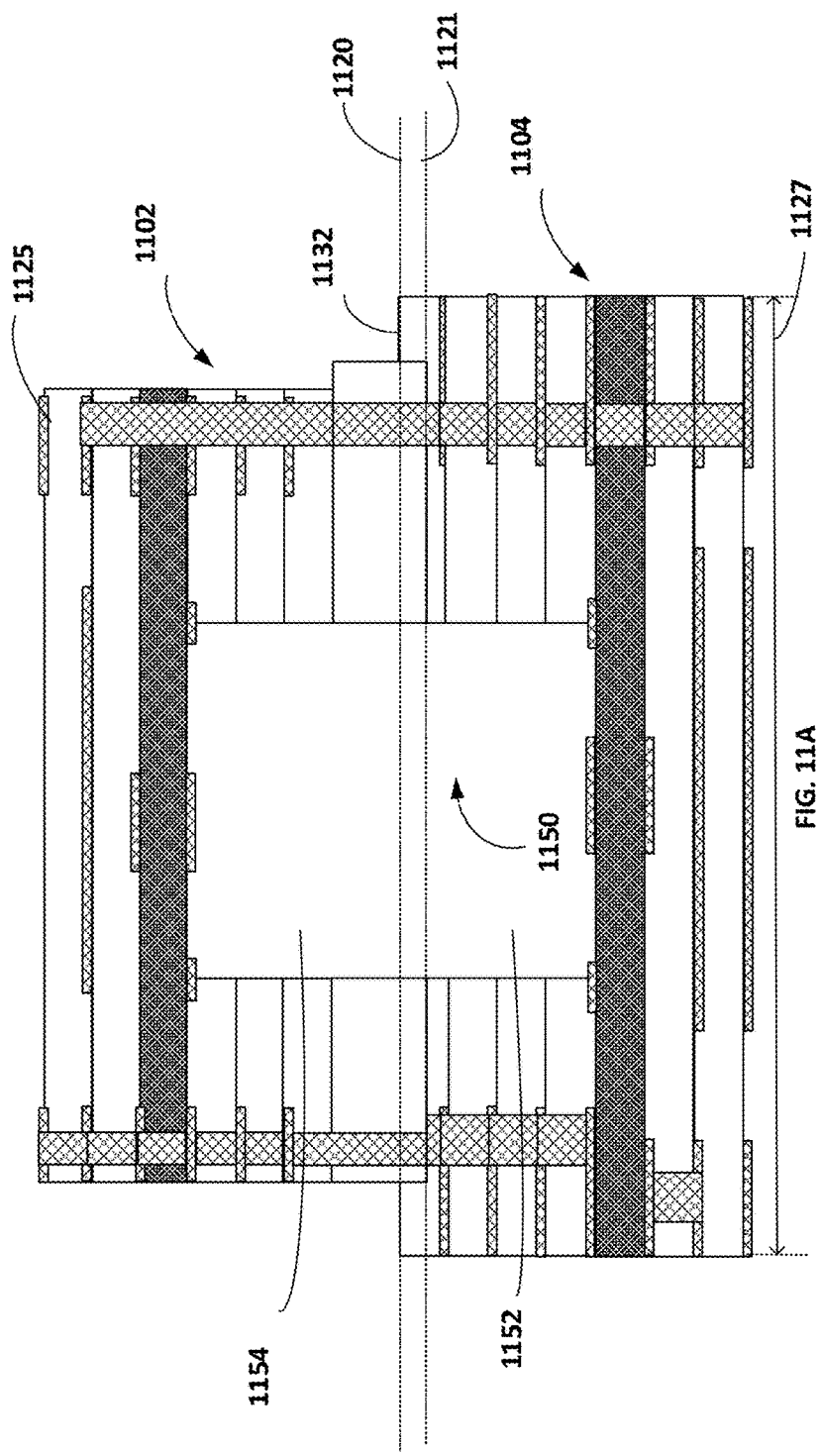
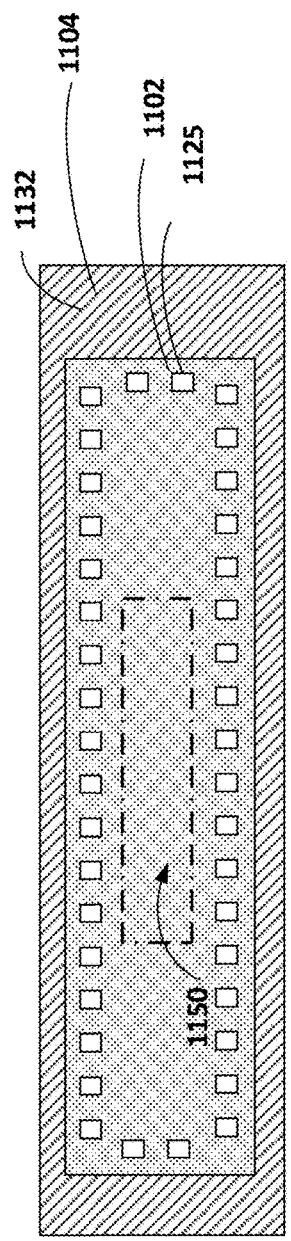
FIG. 11A
FIG. 11B

CAVITY PRINTED CIRCUIT BOARD FOR THREE-DIMENSIONAL IC PACKAGE

CROSS-REFERENCE TO RELATED APPLICATIONS

The present application claims the benefit of the filing date of U.S. Provisional Patent Application No. 63/253,302 filed Oct. 7, 2021, the disclosure of which is hereby incorporated herein by reference.

BACKGROUND

Electronic devices, such as tablets, computers, copiers, digital cameras, smart phones, control systems and automated teller machines, among others, often employ electronic components such as chip assemblies or integrated circuit (IC) dies that are connected by various interconnect components. The chip assemblies or IC dies may include memory, logic, devices, or other IC dies.

The demand for IC dies or chip assemblies for higher performance, higher capacity and lower cost has driven the demand for small sizes and more capable microelectronic components. As a result, the distribution and the distance among the IC dies placed on a printed circuit board (PCB) also becomes denser and closer. The PCB allows multiple electronic components to be mounted thereon to facilitate electrical communications among the electronic components. Vertical stacking of multiple PCBs has been widely utilized to increase the overall numbers of the electronic components that may be packaged in the IC package. However, communications among the electric components in a relatively dense and short distance confined in the PCBs and integration of the electric components disposed among the PCBs with desired small/fine pitch communication signal lines become challenging.

SUMMARY

The present disclosure relates to a cavity PCB that allows multiple electronic components to be disposed therein. The cavity PCB provides additional space and footprints for electronic components with different dimensions, such as different heights, depth and widths, to be disposed therein while providing sufficient surface areas for vertical stacking of the multiple PCBs with desired area for signal line wiring and routing. In one embodiment, a cavity printed circuit board (PCB) includes a first core substrate. A first group of one or more inner substrates is laminated on the first core substrate and a second group of one or more inner substrates is laminated below the first core substrate. A cavity is formed in the first group of inner substrates exposing a surface of the first core substrate. A plurality of circuit pattern structures is formed on the exposed surface of the first core substrate in the cavity, wherein the circuit features include a conductive pad disposed on a conductive material filled in a conductive via.

In one example, a surface plate is disposed on an edge portion of the first group of one or more inner substrates. The surface plate includes multiple conductive features. In one example, a solder mask layer is disposed adjacent to the plurality of circuit pattern structures. The solder mask layer is removed from a top surface of the circuit pattern structures.

Another aspect of the technology is directed to a three-dimensional integrated circuit (IC) packaging structure. The three-dimensional integrated circuit packaging structure include a planar printed circuit board (PCB). A cavity PCB is disposed above or below the planar PCB. A cavity is defined in the cavity PCB formed between the planar PCB and the cavity PCB.

In one example, the cavity has a depth between about 10 μm and about 5 mm The cavity PCB further includes a core substrate, a first group of one or more inner substrates laminated on the core substrate and a second group of one or more inner substrates laminated below the core substrate, wherein the cavity is formed in the first group of inner substrates exposing a surface of the core substrate, and a plurality of circuit pattern structures formed on the exposed surface of the core substrate in the cavity.

In one example, the cavity is surrounded by an edge portion of the first group of one or more inner substrates. One or more electronic components are disposed in the cavity.

Another aspect of the technology is directed to a three-dimensional integrated circuit (IC) packaging structure. The three-dimensional integrated circuit (IC) packaging structure includes a first cavity printed circuit board (PCB) having a first cavity defined on a first surface of the first cavity PCB. A second cavity PCB has a second cavity defined on a second surface of the second cavity PCB. The first cavity PCB is disposed on the second cavity PCB having the first cavity aligned with the second cavity and defined between the first and the second cavity PCBs.

In one example, the first cavity PCB includes a core substrate. A first group of one or more inner substrates is laminated on the core substrate and a second group of one or more inner substrates is laminated below the core substrate. The first or the second cavity is formed in the first group of inner substrates exposing a surface of the core substrate. A plurality of circuit pattern structures is formed on the exposed surface of the core substrate in the first cavity. The first or the second cavity is surrounded by an edge portion of the first group of one or more inner substrates. Edge portions of the first and the second cavity PCB are vertically aligned. A plurality of electronic components is formed in the first cavity defined between the first and the second cavity PCBs.

In one example, the plurality of electronic components is in electrical communications with the plurality of circuit pattern structures disposed in the first cavity. The first cavity PCB has a width greater than a width of the second cavity PCB. A plurality of electronic components is formed an opposite surface of the first surface of the first cavity PCBs where the first cavity is formed. A portion of the first cavity PCB is embedded into the second cavity PCB.

Another aspect of the technology is directed a method for manufacturing a cavity PCB. The method includes forming a laser stop layer on a top surface of a core substrate. A first inner substrate is laminated on the laser stop layer on the top surface of the core substrate. A second inner substrate is laminated below the core substrate. A laser milling process is performed from an upper surface of the first inner substrate to remove a portion of the first inner substrate until the laser stop layer is exposed. The laser stop layer is removed from the core substrate to expose the top surface of the core substrate. A cavity is formed in the first inner substrate. A surface finish layer is formed on the top surface of the core substrate.

DESCRIPTION OF THE DRAWINGS

FIGS. 9A-9B depict a cross-sectional view and a top view of a 3D IC packaging including multiple cavity PCBs in accordance with aspects of the disclosure.

FIGS. 10A-10B depict a cross-sectional view and a top view of another example of a 3D IC packaging including multiple cavity PCBs in accordance with aspects of the disclosure.

FIGS. 11A-11B depict a cross-sectional view and a top view of yet another example of a 3D IC packaging including multiple cavity PCBs in accordance with aspects of the disclosure.

DETAILED DESCRIPTION

The technology relates generally to a cavity printed circuit board (PCB) that allows electronic components to be disposed in a cavity defined in the cavity PCB. By disposing the electronic components in the cavity, the electronic components are embedded in the PCB below a topmost or bottommost surface of the cavity PCB. By doing so, the electronic components with relatively greater height or depth may be disposed in the cavity below the topmost or above the bottommost surface of the cavity PCB to facilitate stacking additional PCBs on the cavity PCB for three-dimensional vertical IC packaging. The cavity formed in the cavity PCB may also provide additional flexibility regarding placements and locations where the electronic components may be disposed so as to provide alternatives of using different types of wiring, interconnection structures or fine-pitch connection lines among the electronic components without adversely occupying much area of the topmost surface or bottommost surface of the cavity PCB.

Figure 1:
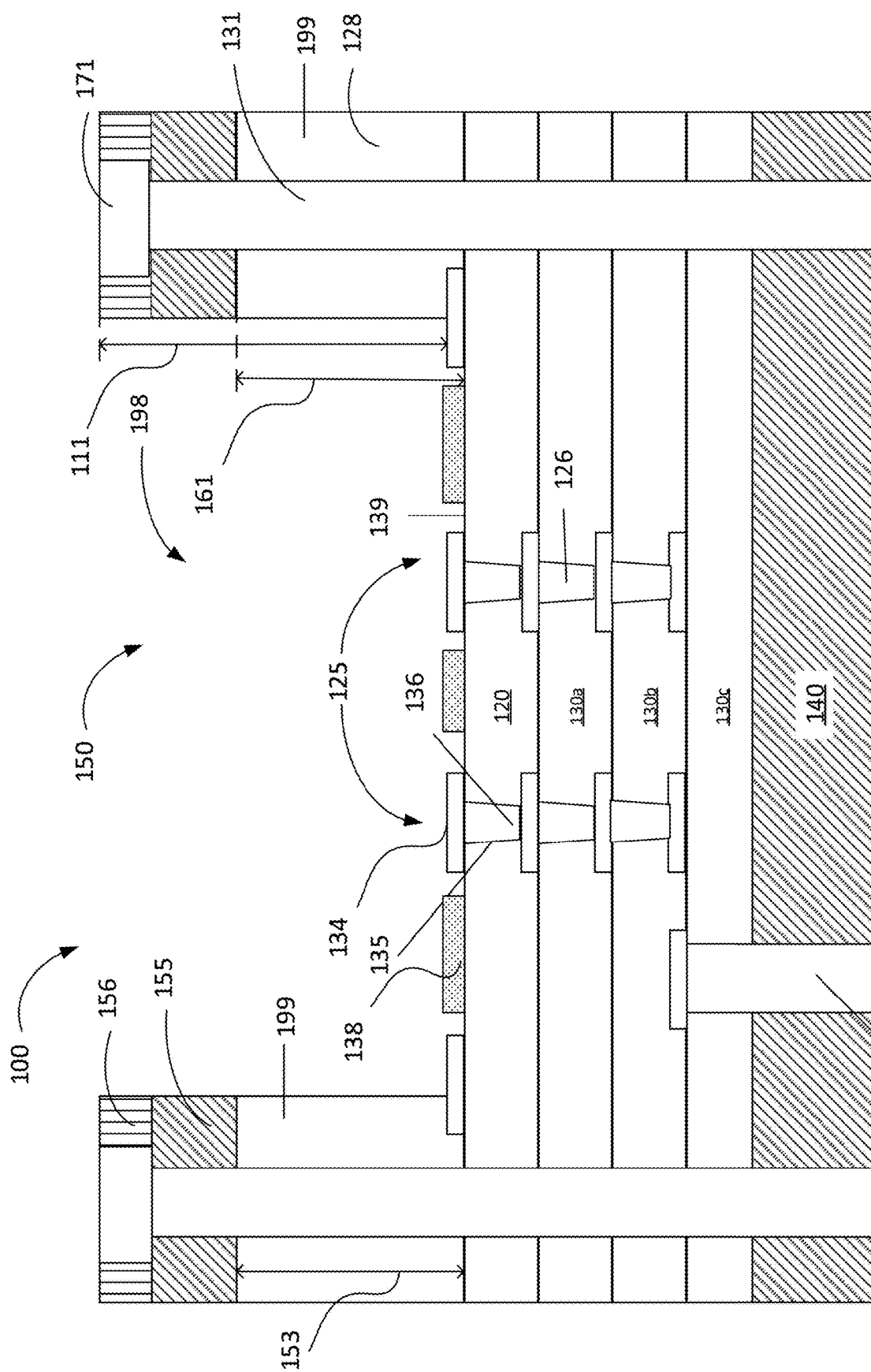
FIG. 1 depicts a cross-sectional view of a cavity PCB in accordance with aspects of the disclosure.

FIG. 1 depicts a cross sectional-view of a cavity PCB 100 having a cavity 150 defined therein. The cavity PCB 100 includes a core substrate 120 having multiple inner substrates 130a-130c and a top substrate 128 disposed adjacent thereto. In some examples, the top substrate 128 may be disposed on the core substrate 120 with other suitable inner substrates. A base structure 140 is included in the cavity PCB 100 where the multiple inner substrates 130a-130c, the core substrate 120 and the top substrate 128 may be disposed on. A circuit pattern structure 125 may be formed on the core substrate 120 to facilitate placement or soldering of the electronic components thereon. As a portion of the top substrate 128 is removed to form the cavity 150 in the top substrate 128, the circuit pattern structure 125 formed in the cavity 150 may be exposed to allow the electronic components to be disposed or soldered thereon. The cavity 150 is defined in the edge portions 199 remained in the top substrate 128 where a center portion 198 of the top substrate 128 is removed to define the cavity 150. Thus, the cavity 150 is surrounded by the edge portions 199 in the top substrate 128.

The circuit pattern structure 125 may include one or more conductive materials that interconnect to provide conductive paths among the top substrate 128, the core substrate 120 and the multiple inner substrates 130a-130c. Each inner substrate 130a-130c may have the same, similar or different conductive path configurations or patterns to facilitate electrical signal communications among the inner substrates 130a-130c, the core substrate 120, the top substrate 128 and the base substrate 140. A through via conductive path 131 may be formed from the base substrate 140 through the inner substrates 130a-130c, the core substrate 120 and the top substrate 128 to provide a conductive path in the cavity PCB 100. It is noted that other types of the conductive paths, such as microvias, may also be formed in the inner substrates 130a-130c, the core substrate 120, the top substrate 128 or other suitable locations to facilitate the electrical communications in the cavity PCB 100 alone or along with the through via conductive path 131.

In one example, the circuit pattern structure 125 may include a conductive pad 134 disposed on a conductive material 136 disposed in a conductive via 135 formed in the core substrate 120. The conductive material 136 may facilitate electrical communications to the conductive materials 126 formed in the underlying inner substrates 130a-130c as well as the conductive structures 127 formed in the base substrate 140. In one example, the conductive material 136 and the conductive structure 127 may be fabricated from at least one of copper, silver, gold, tin, alloys thereof, combinations thereof, or other suitable conductive materials.

A solder mask layer 138 may be optionally disposed on a surface 139 of the core substrate 120 exposed by the cavity 150. The solder mask layer 138 may be a polymer layer applied to the surfaces of the cavity PCBs 100 for surface protection and surface oxidation prevention. A portion of the solder mask layer 138 may be removed to expose the conductive pad 134 that allows the electronic components to be soldered thereon. In one example, the portion of the solder mask layer 138 may be removed by a lithography process, etching process, or any other process.

In one example, a depth 161 of the cavity 150 may be defined by a height 153 of the top substrate 128 laminated to the core substrate 120 along with the inner substrates 130a-130c and the bottom substrate 140. When additional structures, such as an adhesive layer 155 and a surface plate 156, are present, the depth 111 of the cavity 150 may be further increased based on the vertical height from the additional structures. Thus, based on different selection of the height 153 of the top substrate 128, as well as the adhesive layer 155 and the surface plate 156, the cavity 150 with the desired depth 111 may be obtained. In one example, the height 153 of the top substrate 128 as selected may be between 5 μm and about 5 mm, such as between about 153 μm and about 928 μm. The depth 111 of the cavity 150 may be between 10 μm and about 5 mm, such as between about 70 μm and about 1.45 mm In one example, the surface plate 156 may include multiple conductive features 171 formed therein to facilitate electrical communications in the cavity PCB 100 or with external electronic components to be connected, soldered, or molded thereto. In one example, the conductive features 171 may include arrays of ball assemblies.

Figure 2:
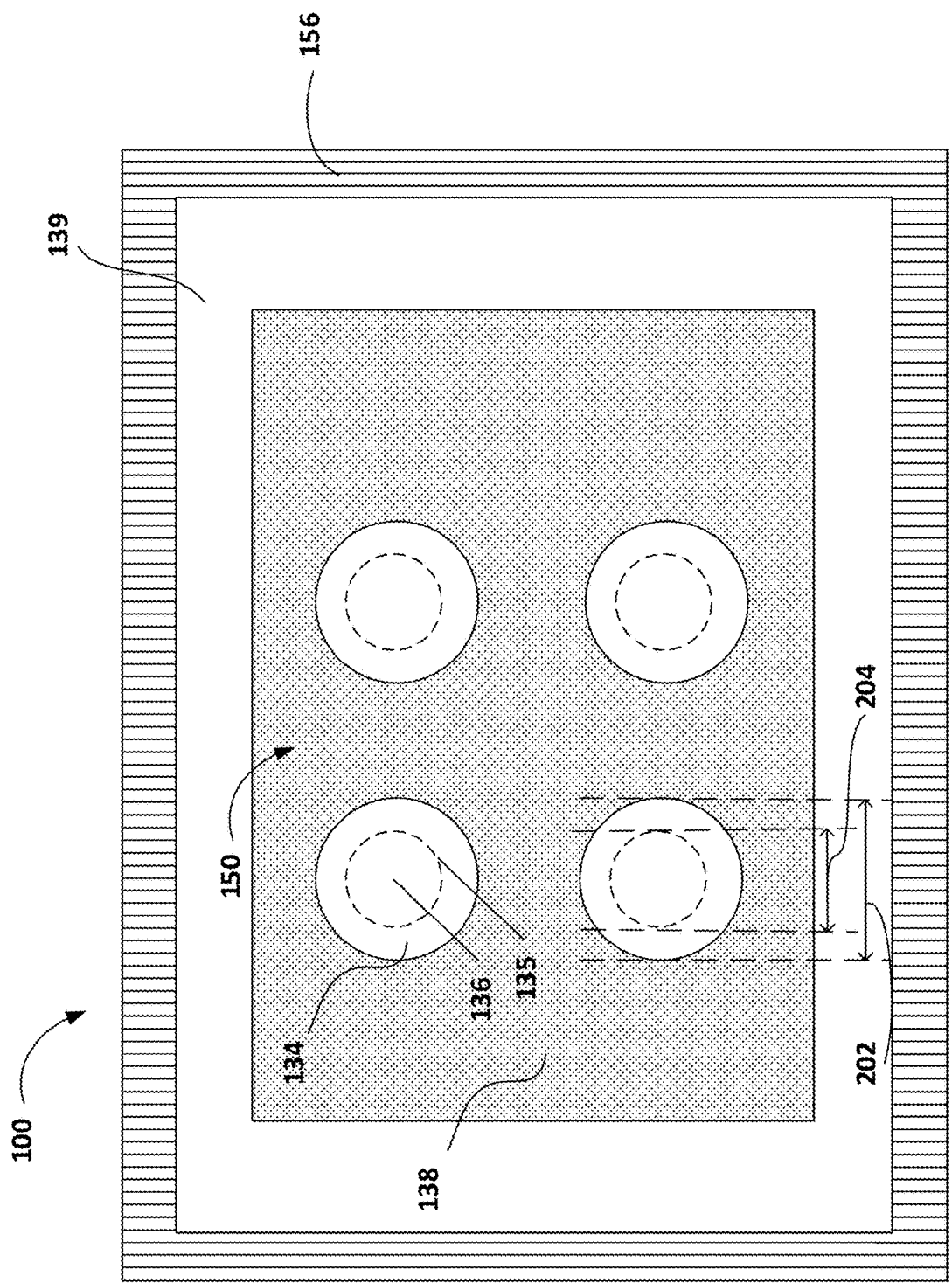
FIG. 2 depicts a top view of the cavity PCB of FIG. 1 in accordance with aspects of the disclosure.

FIG. 2 depicts a top view of the cavity PCB 100 of FIG. 1 in accordance with aspects of the disclosure. The cavity PCB 100 has the cavity 150 defined therein. The conductive pad 134 is electrically and physically connected to the conductive material 136 disposed in the conductive via 135. The solder mask layer 138 is disposed on the surface 139 of the core substrate 120 exposed by the cavity 150. In the example depicted in FIG. 2, the conductive pads 134 have circular patterns. In other examples, the conductive pads may have any of a variety of other shapes or patterns, such as square, rectangular, irregular, etc. It is noted that the conductive pads 134, where the electronic components may be soldered or mounted thereto, may have any suitable configurations or patterns to facilitate placement or soldering of the electronic components thereon. In one example, the conductive pad 134 may have a diameter 202 of between about 10 μm and about 500 μm, such as between about 100 μm and about 400 μm, for example between about 200 μm and 300 μm. The conductive via 135 may have a diameter between about 8 μm and about 450 μm, such as between about 80 μm and about 350 μm, such as between about 170 μm and about 250 μm at an upper opening where the conductive pad 134 may be formed thereon and in contact with. It is noted that the sizes and dimensions of the conductive pads 134 and the conductive via 135 may be varied based on the sizes and dimensions of the electronic components to be mounted and soldered thereon.

Figure 3:
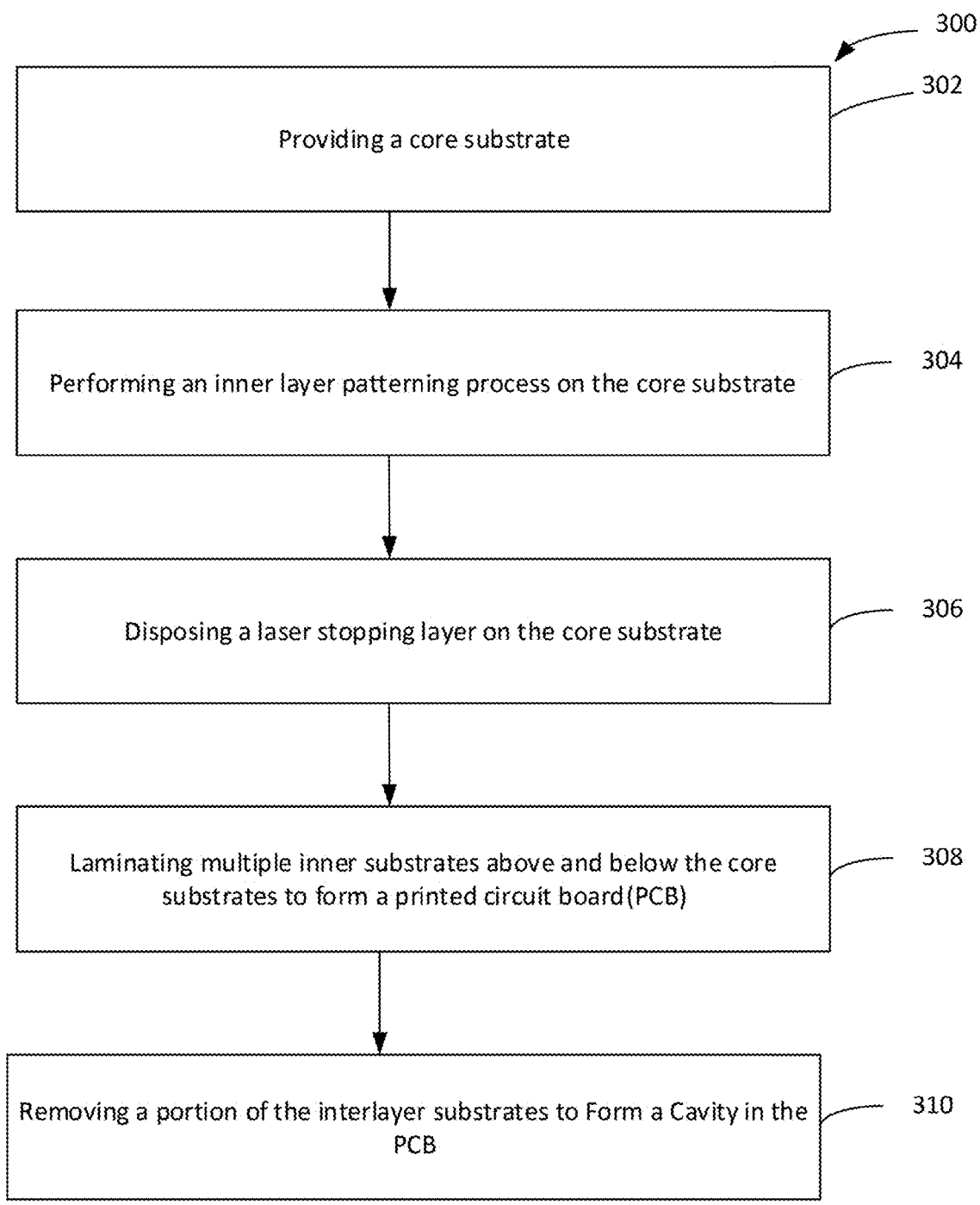
FIG. 3 depicts a flow chart for manufacturing a cavity PCB.

FIG. 3 depicts a flow chart for manufacturing a cavity PCB, such as similar to the cavity PCB 100 described above. FIGS. 4A-4G depict cross-sectional views of the cavity PCB during different manufacturing stages of FIG. 3. Such method may be performed using suitable manufacturing processes, including depositing, etching, lithography, polishing, soldering, or any other suitable techniques. It should be understood that the operations involved in the following methods need not be performed in the precise order described. Rather, various operations may be handled in a different order or simultaneously, and operations may be added or omitted.

Figure 4A:
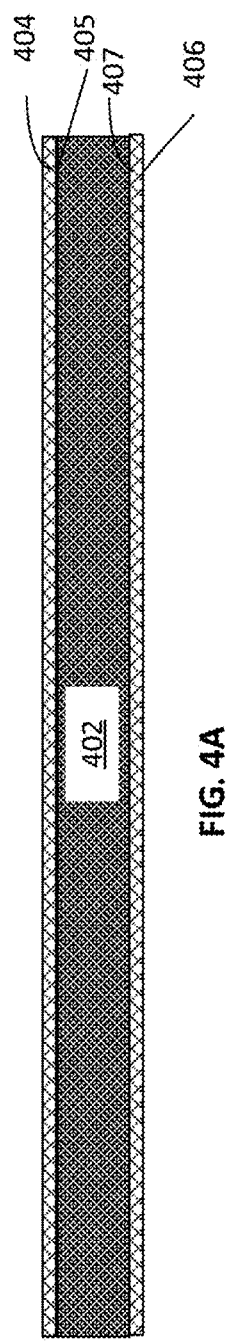
FIGS. 4A-4G depicts cross-sectional view of the cavity PCB during different manufacturing stages of FIG. 3.

Referring to FIG. 3, in block 302, a core substrate 402 is provided, as shown in FIG. 4A. An inner layer 404, 406 may be formed on a top surface 405 and a bottom surface 407 of the core substrate 402. The inner layer 404, 406 may include conductive materials, insulating materials, or other suitable materials that may facilitate forming internal circuit features on both surfaces 405, 407 on the core substrate 402.

Figure 4B:
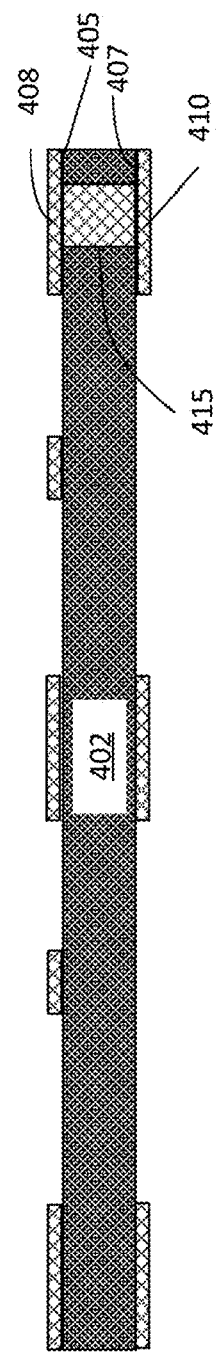

In block 304, an inner layer patterning process is performed to form circuit features 408, 410 on both surfaces 405, 407 of the core substrate 402, as shown in FIG. 4B. Additional processes may be performed prior to, concurrently or after the inner layer patterning process to assist forming the circuit features 408, 410 on the core substrate 402. One or more through vias 407 may be formed in the core substrate 402. One or more conductive materials, such as copper, tin, silver, gold, combinations thereof, alloys, or other suitable materials, may be disposed in the through vias 415 to provide electrical connection between the circuit features 408, 410. Although in the example depicted in FIG. 4B only illustrates one through via 415, it is noted that any number of through vias 415 may be implemented and the positions of such through vias may be varied.

Figure 4C:
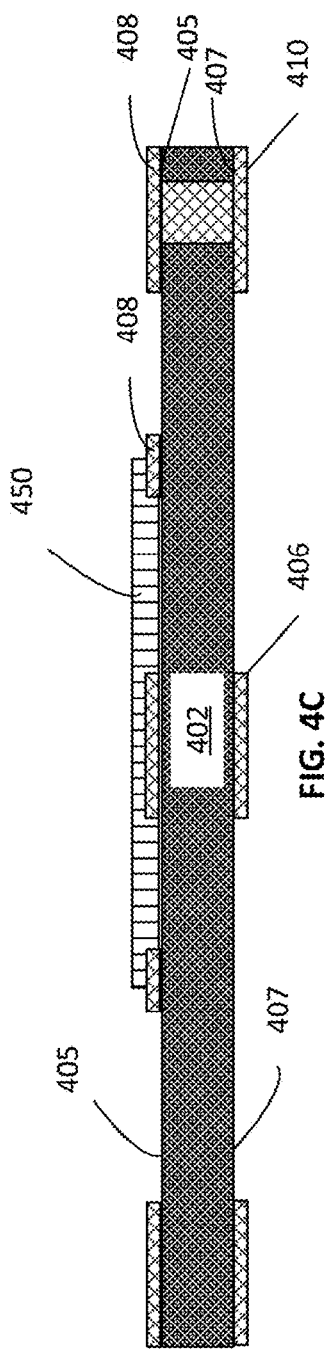

In block 306, a laser stopping layer 450 is formed on the top surface 405 of the core substrate 402, as shown in FIG. 4C. The laser stopping layer 450 serves as a stopper to prevent laser energy from punching through and adversely damaging the structures disposed thereunder. Accordingly, the laser stopping layer 451 may be fabricated from a material that may prevent the laser energy from passing therethrough. In one example, the laser stopping layer 450 may be any suitable structures that may prevent the laser energy to travel therethrough. For example, a conductive material, such as circuit features 408, may be utilized as an example of the laser stopping layer 450 to prevent the laser energy to travel therethrough. In another example, the laser stopping layer 450 may be formed from a heat resistant material that may endure the high heat energy generated during the laser process. Furthermore, the laser stopping layer 450 may also be formed from a material that may be easily attached and detached from the core substrate 402. For example, the laser stopping layer 450 may be a material that has relatively low adhesion to the core substrate 402 so that the laser stopping layer 450 may stay on the top surface 405 of the core substrate 402 during the laser milling process while can also be easily removed and/or peeled off after the laser milling process. In one example, the laser stopping layer 450 may be an insulating material. Suitable examples of the laser stopping layer 450 include epoxy resin, phenolic resin, prefreg, polyimide, polyethylene terephthalate (PET) materials, or other suitable materials. The laser stopping layer 450 may be formed on the core substrate 402.

One or more machining processes may be implemented to form the cavity. Such machining processes may include, for example, laser removal, mechanical drilling, etching process, polishing process, or other processes. The laser stopping layer 450 may then serve as a machining stopping layer to form a barrier that prevents the machining process from further removing material, which may prevent damage to the underlying materials, structures, or layers. Different materials of the laser stopping layer 450 may be selected based on different processes selected to form the cavity in the PCB.

Figure 4D:
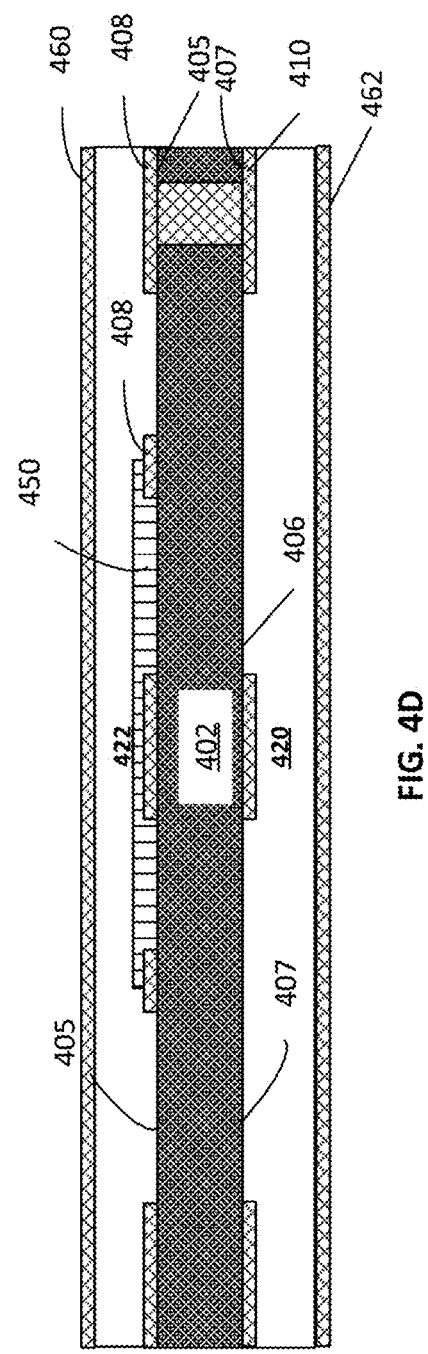
Figure 4E:
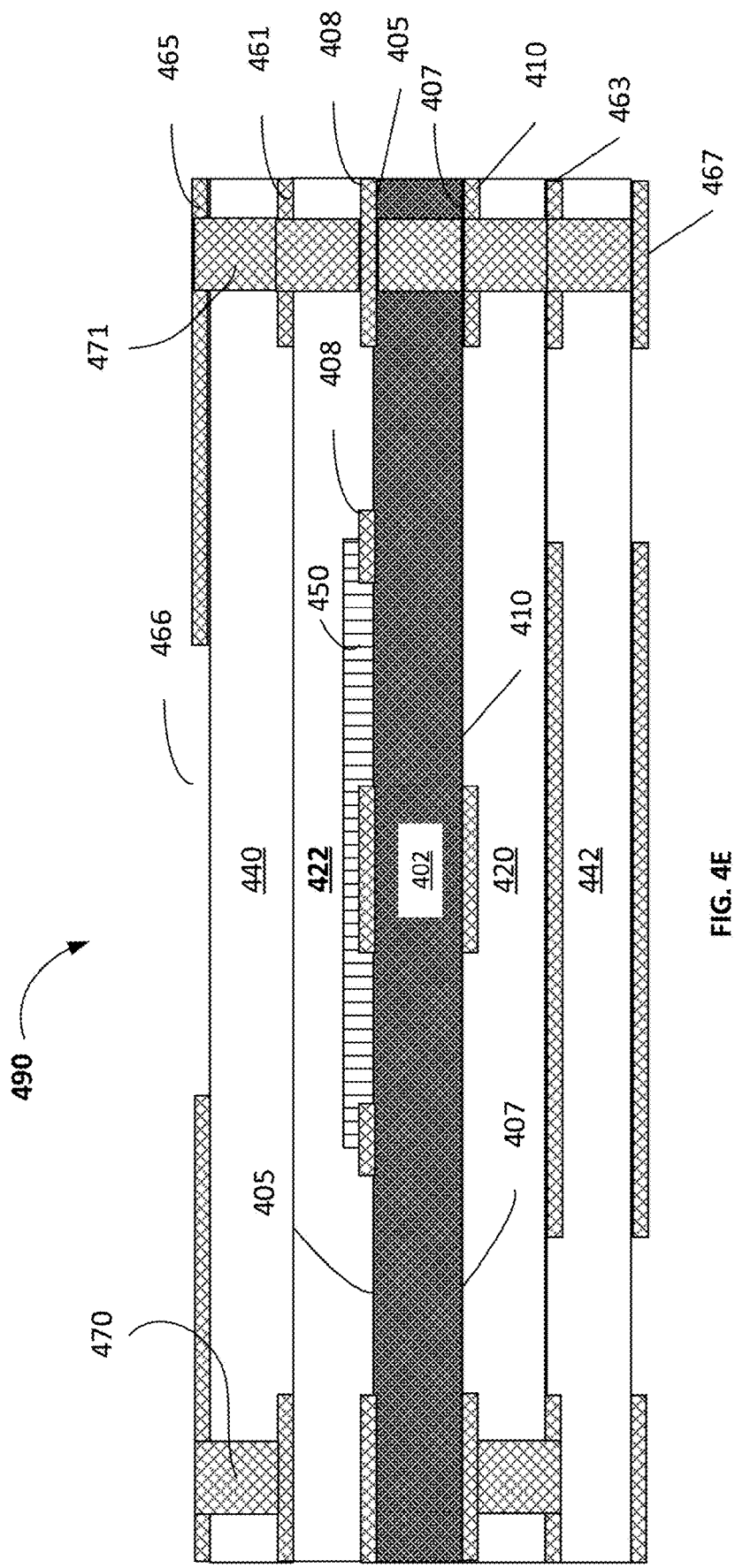

In block 308, a lamination process is performed to laminate one or more inner substrates 422, 420 to one or more surfaces of the core substrate 402, as shown in FIG. 4D. For example, one or more inner substrates 422, 420 may be laminated on the top surface 405 and/or the bottom surface 407 of the core substrate 402. Similarly, additional inner layer 460, 462 may be formed on the inner substrates 422, 420 respectively to facilitate forming circuit patterns or other structures on the inner substrates 422, 420. In the example depicted in FIG. 4E, additional processes, such as lamination processes, patterning processes, etching processes, lithography processes, or other processes, may be performed to form additional inner substrates 440, 442 on the core substrate 402 with the desired circuit patterns 461, 463, 467 on the inner substrates 440, 422, 420, 442, or other suitable locations. A surface plate 465 may be formed on the inner substrate 440 to provide surface protection. An opening 466 may be formed in the surface plate 465 to expose a portion of the inner substrate 440 to form a cavity in the PCB 490 in the subsequent milling, etching, or patterning process. Through vias 470, 471 may be formed between the inner substrates 440, 422, 420, 422 or through the overall inner substrates 440, 422, 420, 442 from the uppermost inner substrate 440 to the bottommost inner substrate 442.

After the one or more inner substrates 440, 422, 420, 422 are laminated with the core substrate 402, a preliminary structure of a PCB 490 is formed.

Figure 4F:
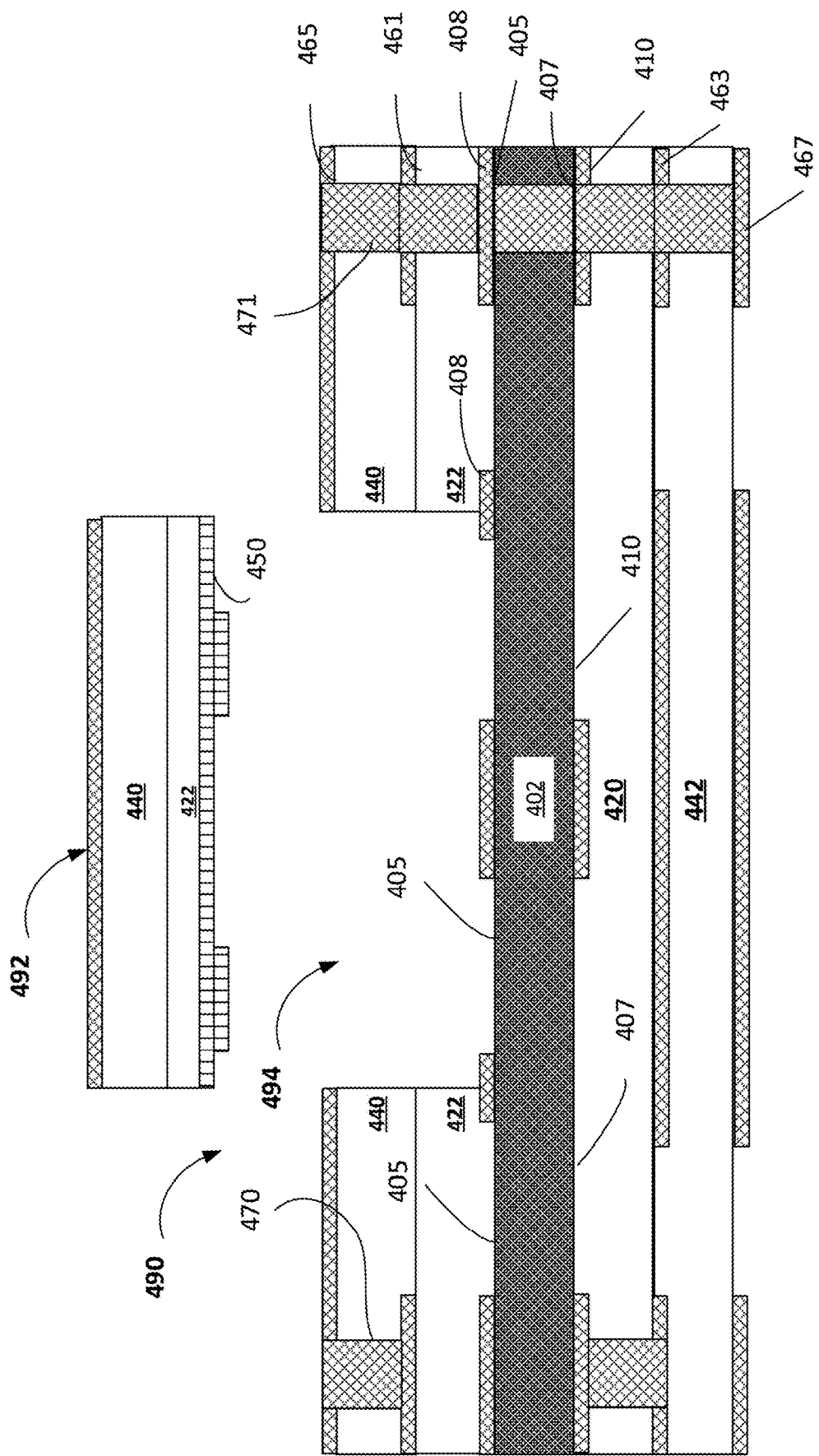

In block 310, a portion 492 of the PCB 490 is removed, forming a cavity 494 in the PCB 490, as shown in FIG. 4F. The portion 492 of the PCB 490 may be removed by any suitable removing, patterning or milling process. In one example, a laser milling process is utilized to remove the portion 492 from the PCB 490 to form the cavity 494 with the desired dimension in the PCB 490. As described above, the laser stopping layer 450 serves as a process end point layer during the removing, patterning or milling process. Once the laser stopping layer 450 is exposed, the removing, patterning or milling process may be terminated. As the laser stopping layer 450 is selected from a material that may be easily removed or peeled from the core substrate 402, thus when the removing, patterning or milling process is terminated, the laser stopping layer 450 may be easily removed along with the portion 492 of the PCB 490 where the removing, patterning or milling process are performed therethrough. Once the portion 492 and the laser stopping layer 450 is removed, a portion of the top surface 405 of the core substrate 402 is exposed.

Figure 4G:
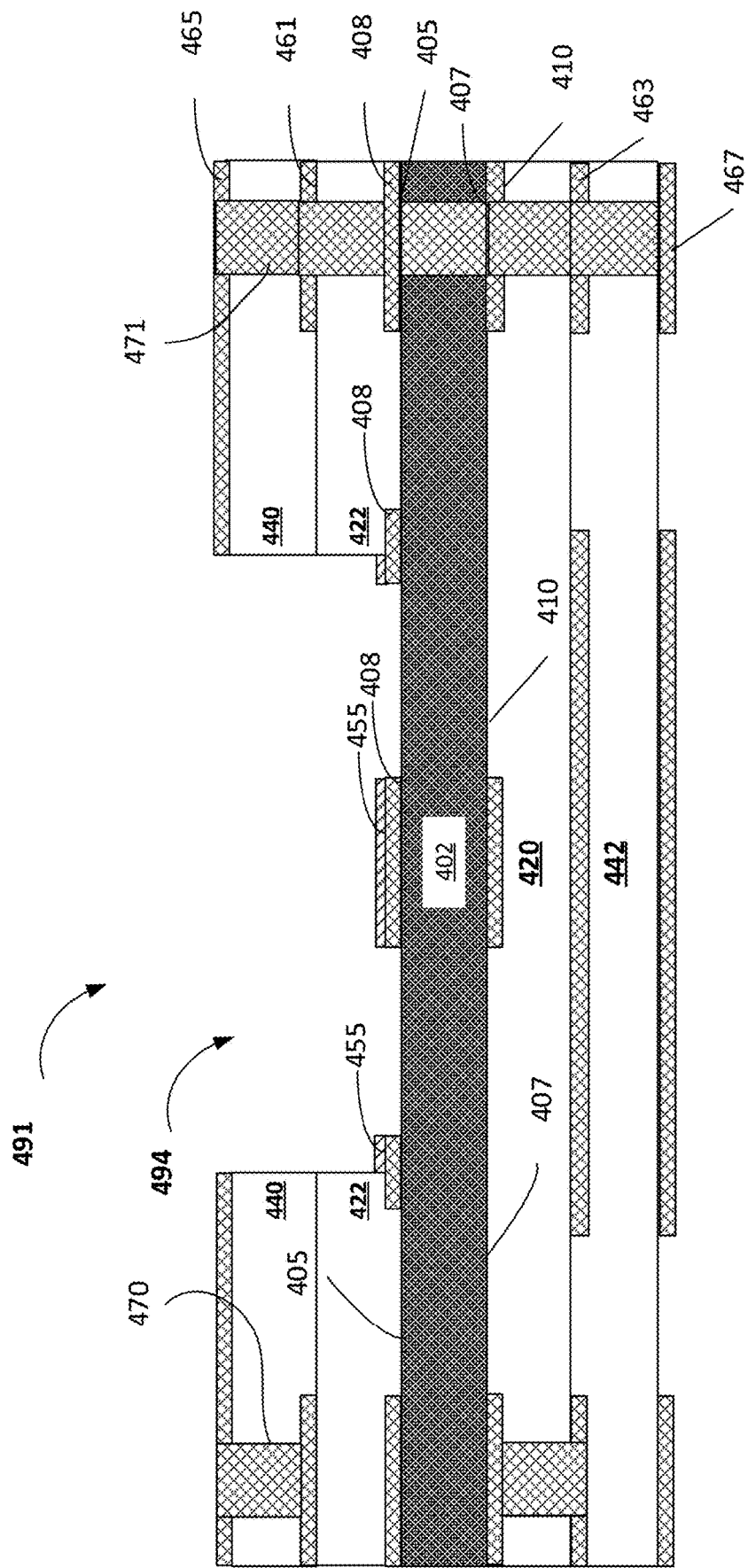

After the portion of the PCB 490 is removed, a cavity PCB 491 is formed with the cavity 494 defined therein, as shown in FIG. 4G. A surface finish process may be performed to form a surface finish layer 455 on the circuit features 408. The surface finish layer 455 may be any suitable surface protection layer that prevents the circuit features 408 from moisture, oxidation, or damage prior to the placement of the electronic components. In one example, the surface finish layer 455 is an oxide layer, a nitride layer, combinations thereof, composite materials thereof, or any suitable insulating materials.

Figure 5:
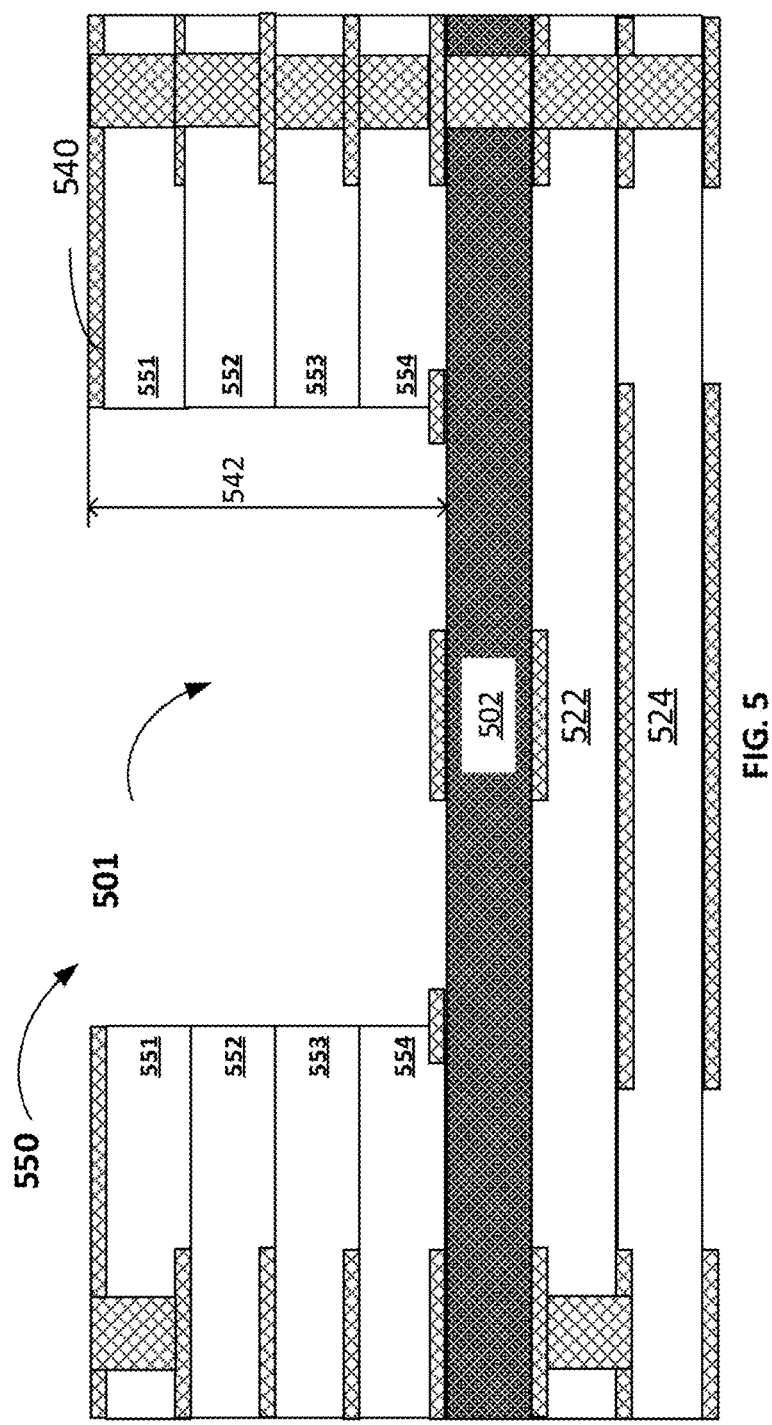
FIG. 5 depicts a cross-sectional view of another example of a cavity PCB in accordance with aspects of the disclosure.

FIG. 5 depicts a cross-sectional view of another example of a cavity PCB 550 having a cavity 501 defined therein in accordance with aspects of the disclosure. Similar to the structure depicted in FIG. 4G, the cavity PCB 550 includes a first group of one or more inner substrates 522, 524, similar to the inner substrates 422, 442 described above, laminated with the core substrate 502. In the example depicted in FIG. 5, a second group of one or more inner substrates, such as four additional inner substrates 551, 552, 553, 554, are disposed on the core substrate 502, along with a surface plate 540, if any, which in combination defines a depth 542 of the cavity 501 formed in the cavity PCB 550. In the example where additional inner substrates or other structures or materials are formed between the surface plate 540 and the inner substrates 551, 552, 553, 554, the depth 542 of the cavity 501 defined in the PCB 550 may be varied and adjusted. It is noted that although four inner substrates 551, 552, 553, 554 are utilized in FIG. 5 to define the depth 542 of the cavity 501, it is noted that the inner substrates may be in any number suitable for depth adjustment of the cavity 501.

Figure 6:
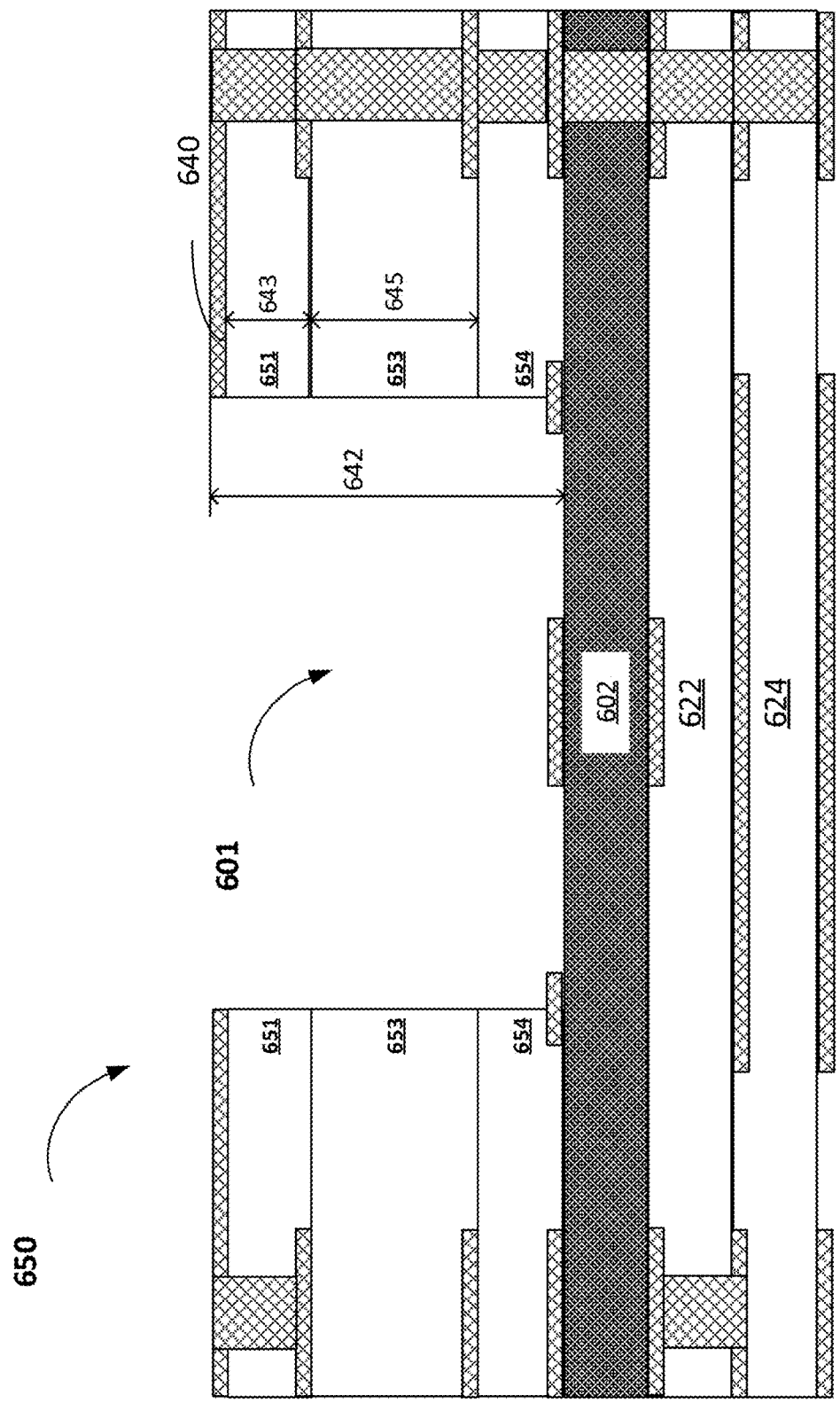
FIG. 6 depicts a cross-sectional view of yet another example of a cavity PCB in accordance with aspects of the disclosure.

FIG. 6 depicts a cross-sectional view of another example of a cavity PCB 650 having a cavity 601 defined therein in accordance with aspects of the disclosure. Similar to the structure depicted in FIG. 5, the cavity PCB 650 includes a first group of one or more inner substrates 622, 624, similar to the inner substrates 422, 442 described above, laminated with the core substrate 602. In the example depicted in FIG. 6, a second group of one or more inner substrates, such as three additional inner substrates 651, 653, 654 with similar or different heights 643, 645 or thickness, are disposed on the core substrate 602, along with a surface plate 640, if any, which in combination defines a depth 642 of the cavity 601 formed in the cavity PCB 650. In the example depicted in FIG. 6, the inner substrate 653 is configured to have a height 645 relatively longer to a height 643 of the inner substrate 651, 654. By doing so, the depth of the cavity 601 defined in the PCB 650 may be efficiently adjusted or varied without the need of using additional inner substrates. Thus, based on the depth requirement of the cavity 601, inner substrates with different heights or thickness may be selected to facilitate forming the cavity 601 with a desired depth.

Figure 7A:
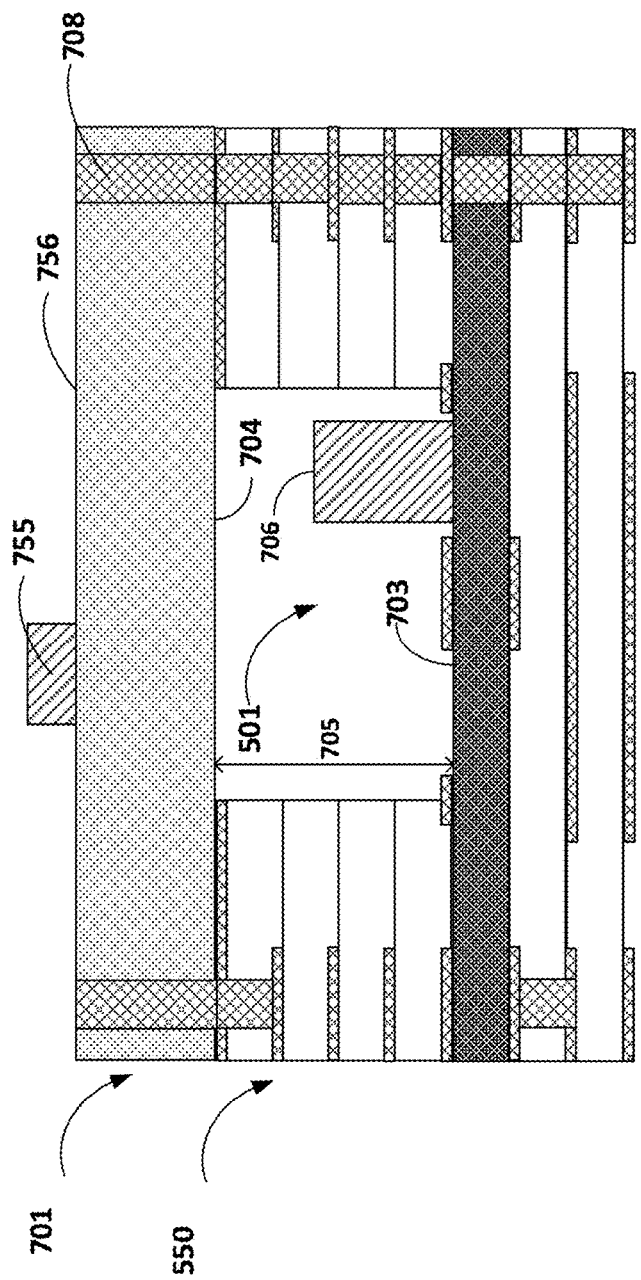
FIG. 7A depicts a cross-sectional view of a 3D IC packaging including a planar PCB and a cavity PCB in accordance with aspects of the disclosure.

FIG. 7A depicts a cross-sectional view of a 3D IC packaging structure including a planar PCB 701 and the cavity PCB 550 of FIG. 5 in accordance with aspects of the disclosure. It is noted that the detail structures, such as inner substrates, circuit patterns, and the like, formed in the planar PCB 701 is eliminated in the drawings for ease of illustration and description. The planar PCB 701 as described herein refers to the PCB without a cavity defined therein to that the electronic components may be soldered and mounted on suitable surfaces of the planar PCB 701. When vertically stacking multiple PCBs, different numbers, selections or combinations of planar PCBs and/or cavity PCBs may be utilized. In the example depicted in FIG. 7A, the planar PCB 701 is disposed on the cavity PCB 550. Thus, the cavity 501 is enclosed between the planar PCB 701 and the cavity PCB 550. The cavity 501 formed therein allows one or more electronic components 706 to either be disposed on the surface 703 of the cavity PCB 550 or on the surface 704 of the planar PCB 701. The height 705 of the cavity 501 may determine the dimensions of the electronic components 706 that can be placed in the cavity 501. Thus, when electronic components 706 with relatively larger dimensions, such as a large height of the electronic components, are to be placed and disposed on the surface 703 of the cavity PCB 550 or the surface 704 of the planar PCB 701, a relatively larger depth 705 of the cavity 501 formed in the cavity PCB 550 may be selected, or vise versa. It is noted that the planar PCB 701 may be any suitable PCBs with one or more inner substrates laminated, similar to the structure depicted in FIG. 4E without the cavity formed therein, to allow electronic components to be solder mounted thereon. It is noted that the electronic components 755 may also be formed at any other suitable locations, including on the top surface 756 of the planar PCB 701 opposite to the surface 704 facing and exposed to the cavity 501. Similar configurations may also be applied to all the drawings exampled in the present disclosure.

Figure 7B:
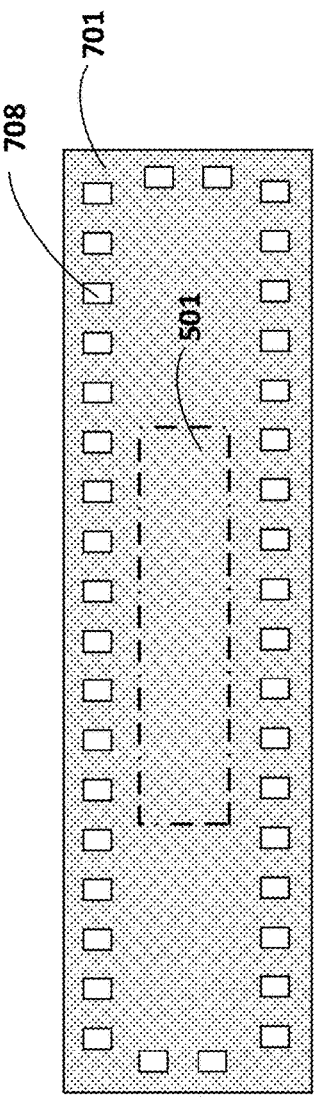
FIG. 7B depicts a top view of the 3D IC packaging of FIG. 6A in accordance with aspects of the disclosure.

FIG. 7B depicts a top view of the 3D IC packaging structure of FIG. 7A in accordance with aspects of the disclosure. The planar PCB 701 is disposed on the cavity PCB 550. The cavity 501 is shown in dotted line in FIG. 7B. An array of soldering pads 708 may be formed on the planar PCB 701 to facilitate electrical communications between the planar PCB 701 and the cavity PCB 550. It is noted that the numbers and the configurations of the soldering pads 708 may be varied or adjusted based on the dimensions and configurations of the planar PCB 701 and/or the cavity PCB 550.

Figure 8:
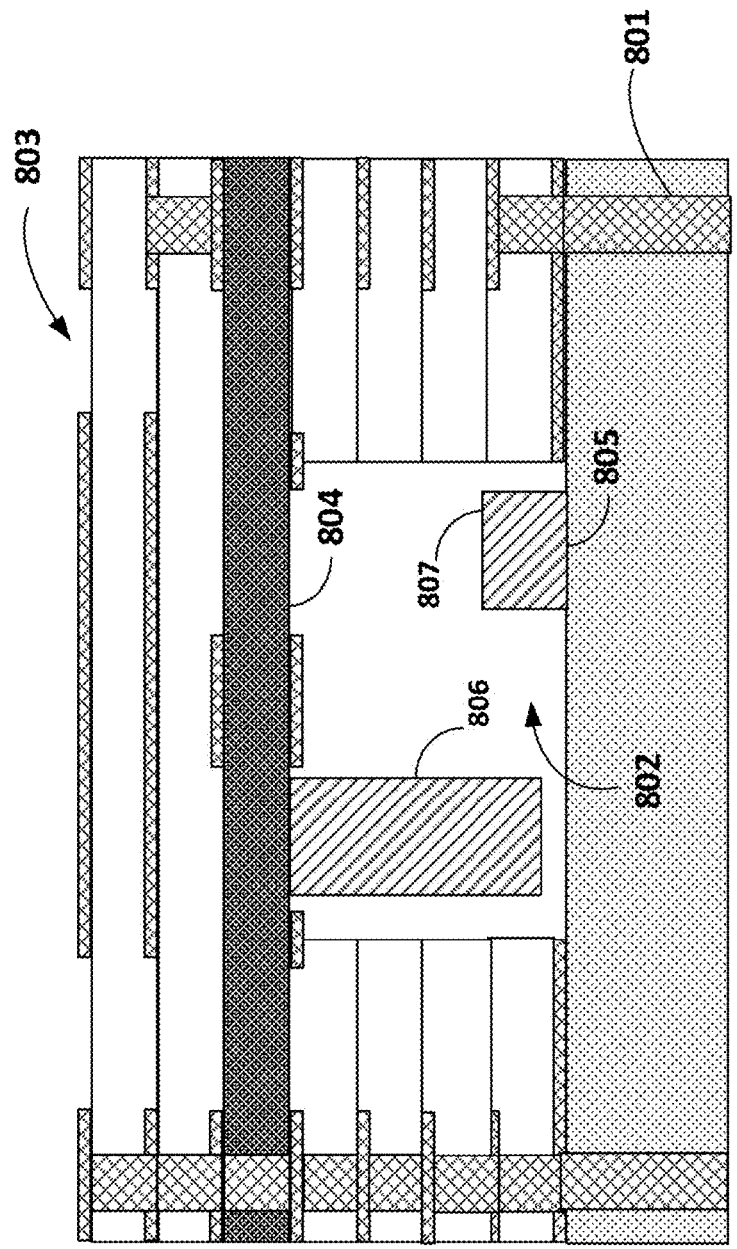
FIG. 8 depicts a cross-sectional view of another example of a 3D IC packaging including a planar PCB and a cavity PCB in accordance with aspects of the disclosure.

FIG. 8 depicts a cross-sectional view of a 3D IC packaging structure including a planar PCB 801 and a cavity PCB 803, similar to the cavity PCB 550 of FIG. 5 in accordance with aspects of the disclosure. In this example, the cavity PCB 803 is flipped and rotated for 180 degrees to be disposed on the planar PCB 801. Thus, in this example, the planar PCB 801 is formed as a base that allows the cavity PCB 803 to be mounted thereon with the cavity 802 defined therein. Electronic components 806, 807 may be disposed in the cavity 802 on the surface 804 of the cavity PCB 803 and/or on the surface 805 of the planar PCB 801 or other suitable locations either on the cavity PCB 803 or on the planar PCB 801.

FIGS. 9A depict a cross-sectional view of a 3D IC packaging structure including multiple cavity PCBs 902, 904 in accordance with aspects of the disclosure. The cavity PCBs 902, 904 are similar to the cavity PCB 550 of FIG. 5. It is noted that other configurations or types of the cavity PCBs may also be utilized. In the example depicted in FIG. 9A, the first cavity PCB 902 is rotated and flipped for 180 degrees to have the cavity 954 aligned with the cavity 952 defined in the second cavity PCB 904. Thus, the cavities 954, 952 from the first and the second PCBs 902, 904 are then aligned at the interface 920 formed at the joint surfaces of the first and the second PCBs 902, 904. By utilizing two cavity PCBs 902, 904 with the cavities 954, 952 aligned and enclosed between the two cavity PCBs 902, 904, the resultant cavity 950 may have a relatively large dimension that allows electronic components with relatively large sizes to be placed therein. It is noted that the resultant cavity 950 defined between the two cavity PCBs 902, 904 may be in any suitable dimensions by selecting the cavity PCBs 902, 904 with the desired dimensions of the cavities 954, 952 to be aligned and combined. In one example, a plurality of electronic components 998 may be formed an opposite surface 996 of the surface 995 exposed by the cavity 954 defined in the first cavity PCB 902. Similarly, electronic components (not shown) may also be formed on an opposite surface 992 of a surface 991 exposed by the second cavity 952 defined by the second cavity PCB 904.

FIG. 9B depicts a top view of the 3D IC packaging of FIG. 9A in accordance with aspects of the disclosure. The first cavity PCB 902 is disposed on the second cavity PCB 904. The cavity 950 is shown in dotted line in FIG. 9B. An array of soldering pads 925 may be formed on the first cavity PCB 902 to facilitate electrical communications between the first and the second cavity PCB 902, 904. It is noted that the numbers and the configurations of the soldering pads 925 may be varied or adjusted based on the dimensions and configurations of first and the second cavity PCB 902, 904. Furthermore, the soldering pads 925 may also have via-on-pad or via-in-pad with varied shapes and dimensions to provide electrical connections between the inner substrates.

FIGS. 10A depict a cross-sectional view of a 3D IC packaging structure including multiple cavity PCBs 1002, 1004 with different dimensions in accordance with aspects of the disclosure. The cavity PCBs 1002, 1004 are similar to the cavity PCBs 902, 904, except that the second cavity PCB 1004 has a larger dimension than that of the first cavity PCB 1002. It is noted that other configurations or types of the cavity PCBs may also be utilized. In the example depicted in FIG. 10A, the first cavity PCB 1002 is rotated and flipped for 180 degrees to have the cavity 1054 aligned with the cavity 1052 defined in the second cavity PCB 1004. Thus, the cavities 1054, 1052 from the first and the second PCBs 1002, 1004 are then aligned at the interface 1020 formed at the joint surfaces of the first and the second PCBs 1002, 1004. By utilizing two cavity PCBs 1002, 1004 with the cavities 1054, 1052 aligned and enclosed between the two cavity PCBs 1002, 1004, the resultant cavity 1050 may have a relatively large dimension that allows electronic components with relatively large sizes to be placed therein. Furthermore, as the dimension, such as a width 1027, of the second cavity PCB 1004 is greater than that of the first cavity PCB 1002, additional electronic wirings, electronic routes, or connection pins may be formed on the exposed regions 1032 not covered by the first cavity PCB 1002.

FIG. 10B depicts a top view of the 3D IC packaging structure of FIG. 10A in accordance with aspects of the disclosure. The first cavity PCB 1002 is disposed on the second cavity PCB 1004. The cavity 1050 is shown in dotted line in FIG. 10B. An array of soldering pads 1025 may be formed on the first cavity PCB 1002 to facilitate electrical communications between the first and the second cavity PCB 1002, 1004. Additional electronic wirings, electronic routes, or connection pins (not shown) may be formed on the exposed regions 1032 not covered by the first cavity PCB 1002.

FIGS. 11A depict a cross-sectional view of a 3D IC packaging structure including multiple cavity PCBs 1102, 1104 with different dimensions in accordance with aspects of the disclosure. The cavity PCBs 1102, 1104 are similar to the cavity PCBs 1002, 1004, except that the second cavity PCB 1104 has a larger dimension than that of the first cavity PCB 1102 and a portion of the first cavity PCB 1102 is mounted and molded into the second cavity PCB 1104. For example, a bottommost surface 1121 from the first cavity PCB 1102 may be molded and embedded into and below a topmost surface 1120 of the second cavity PCB 1104. Thus, the bottommost surface 1121 of the first cavity PCB 1102 is embedded in a body of the second cavity PCB 1104 below the topmost surface 1120 of the second cavity PCB 1104. By doing so, a relatively larger contact area of the electronic pins, routes, or wires formed between the first and the second cavity PCBs 1102, 1104 may be obtained.

FIG. 11B depicts a top view of the 3D IC packaging of FIG. 11A in accordance with aspects of the disclosure. The first cavity PCB 1102 is disposed on and has a portion embedded and molded in the second cavity PCB 1104. The cavity 1150 is shown in dotted line in FIG. 11B. An array of soldering pads 1125 may be formed on the first cavity PCB 1102 to facilitate electrical communications between the first and the second cavity PCB 1102, 1104. Additional electronic wirings, electronic routes, or connection pins (not shown) may be formed on the exposed regions 1132 not covered by the first cavity PCB 1102.

Figure 12:
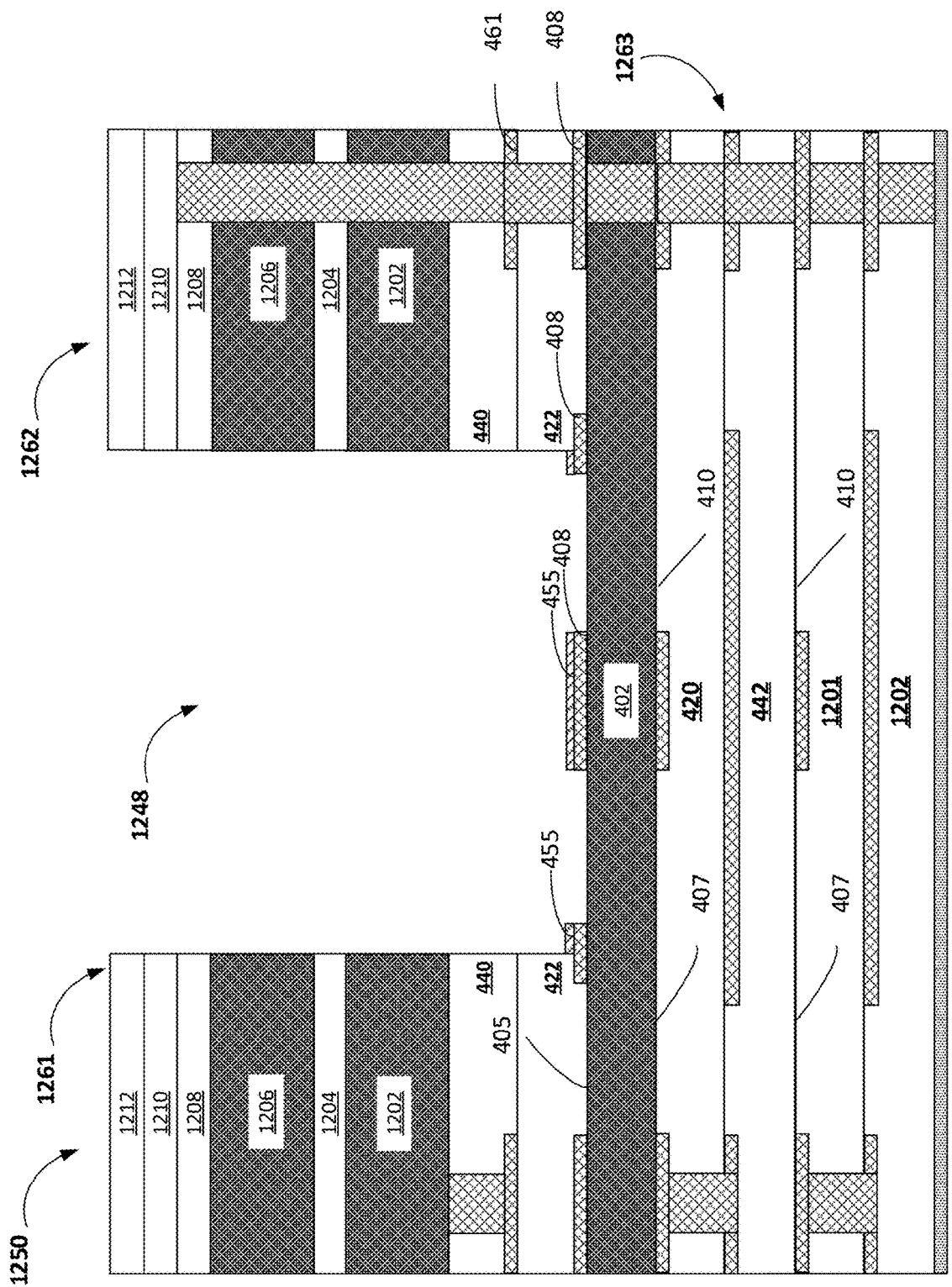
FIG. 12 depicts a cross-sectional view of another example of a cavity PCB in accordance with aspects of the disclosure.

FIG. 12 depicts a cross sectional-view of another example of a cavity PCB 1250 having a cavity 1248 defined therein. Similar to the cavity PCB 100 described with reference to FIG. 1, the cavity PCB 1250 has a first core substrate 402. Multiple inner substrates 420, 422, 440, 442 may be disposed adjacent to, such as below, the first core substrate 402. In the example depicted in FIG. 12, additional core substrates 1202, 1206 may be utilized to increase and strengthen the hardness of the cavity PCB 1250. For example, a second core substrate 1202, similar to the first core substrate 402, and/or a third core substrate 1206 may be utilized and disposed on the first core substrate 402 with additional inner substrates 1202, 1208, 1210 disposed therebetween and/or adjacent thereto. The materials selected to manufacture the core substrates 402, 1202, 1206 may be different from the materials selected to manufacture the inner substrates 420, 422, 440, 442, 1201, 1202, 1204, 1208, 1210. For example, the material selected to manufacture the core substrates 402, 1202, 1206 may be a relatively rigid material, as compared to the material selected to manufacture the inner substrates 420, 422, 440, 442, 1201, 1202, 1204, 1208, 1210. Thus, the core substrates 402, 1202, 1206 may provide the support in the overall structure of the cavity PCB 1250. Thus, the likelihood of warpage that occurs when conventional PCBs exceed certain thickness may be reduced or eliminated. In the examples where a greater thickness of the cavity PCB 1250 is desired, greater numbers of core substrates may be utilized and disposed among the inner substrates to increase the support, strength, and rigidity of the cavity PCB 1250. In one example, the core substrates 402, 1202, 1206 may be fabricated from a material having increased hardness than the materials selected to manufacture the inner substrates 420, 422, 440, 442, 1201, 1202, 1204, 1208, 1210.

In the example depicted in FIG. 12, three core substrates 402, 1202, 1206 are utilized and disposed among the inner substrates 420, 422, 440, 442, 1201, 1202, 1204, 1208, 1210. The first core substrate 402 may first be the inner substrates 440, 422, 1204, 1208, 1210 with or without the cavity 1248 formed therein. The second core substrate 1202 and/or the third substrate 1206 may then be further coupled to the first core substrate 402 and the inner substrates 420, 422, 440, 442, 1201, 1202, 1204, 1208, 1210 to form the resultant cavity PCB 1250.

In one example, the cavity 1248 is formed between a first stack 1261 and a second stack 1262 of the structures formed from the second core substrate 1202 and/or the third substrate 1206 and the inner substrates 440, 422, 1204, 1208, 1210. During the manufacturing process, the first stack 1261 and the second stack 1262 may maintain symmetry so that the weight added on the base part 1263 may be evenly distributed, thereby reducing the likelihood of creating warpage to the resultant cavity PCB 1250.

Figure 13:
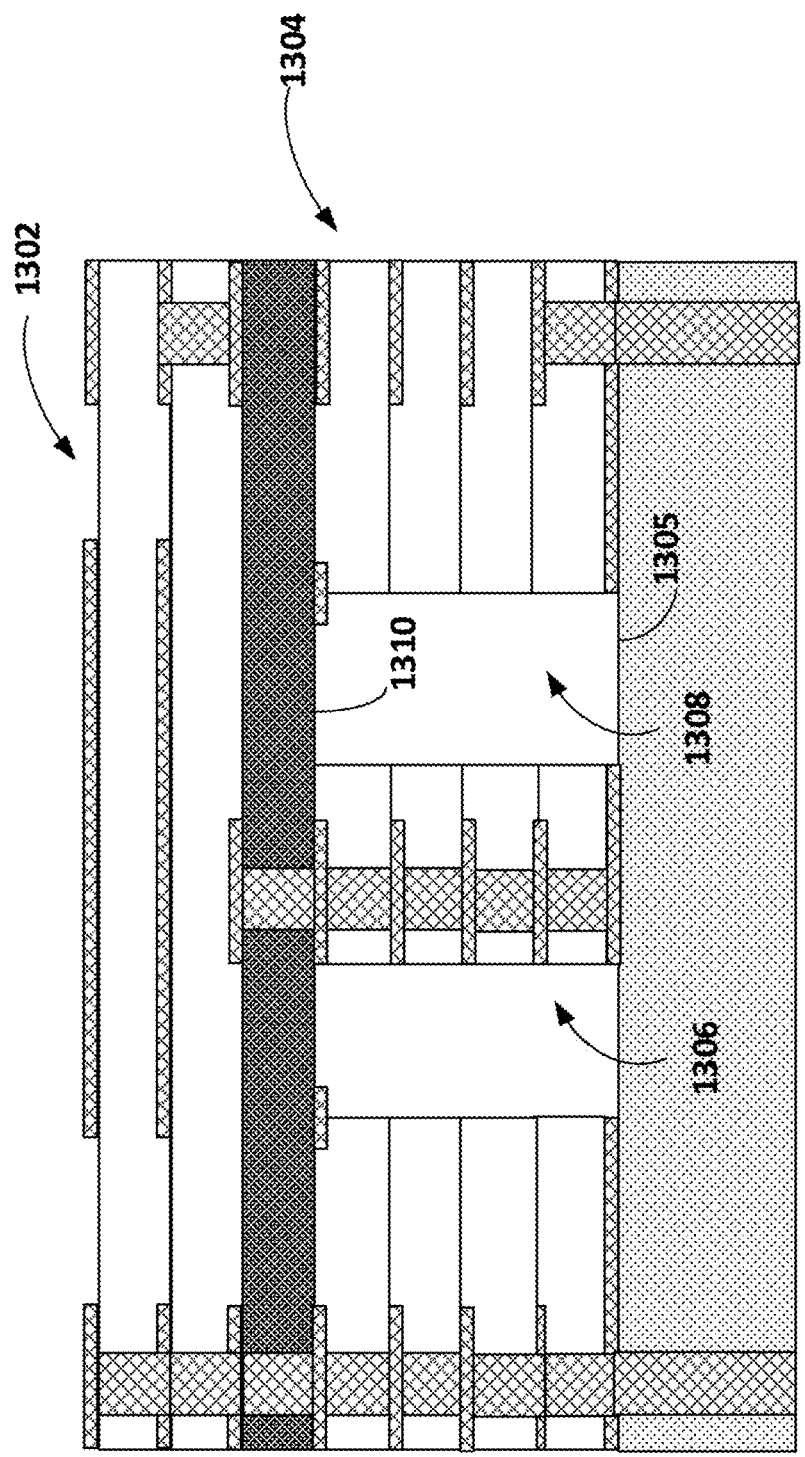
FIG. 13 depicts a cross-sectional view of another example of a 3D IC packaging including a planar PCB and a cavity PCB having multiple cavities defined therein in accordance with aspects of the disclosure

FIG. 13 depicts a cross-sectional view of yet another example of a 3D IC packaging structure including a planar PCB 1302 and a cavity PCB 1304, similar to the cavity PCB 550 of FIG. 5 in accordance with aspects of the disclosure. In this example, the cavity PCB 1304 includes multiple cavities 1306, 1308. In this example, the planar PCB 1302 is formed as a base that allows the cavity PCB 1304 to be mounted thereon with the cavities 1306, 1308 defined therein. Electronic components (not shown) may be disposed in the cavities 1306, 1308 on the surface 1305 of the cavity PCB 1306 and/or on the surface 1310 of the planar PCB 1302 or other suitable locations either on the cavity PCB 1304 or on the planar PCB 1302. It is noted that the cavity PCB 1304 may be packaged with other PCB with any configurations, such as planar PCB, cavity PCB, or other suitable types of PCBs.

The features described herein provide a cavity PCB that allows electronic components with different dimensions disposed therein. By providing a cavity in a PCB, the electronic components may be disposed and placed in the cavity defined in the PCB below a topmost or bottommost surface of the cavity PCB. Thus, the electronic components with relatively higher height or depth may be disposed in the cavity below the topmost or above the bottommost surface of the cavity PCB without occupying much of the space in a 3D packaging structure. The cavity formed in the cavity PCB may also provide additional flexibility regarding placements and locations where the electronic components may be disposed in the 3D vertical stacking of the IC devices so as to provide alternatives of using different types of wiring or interconnection structures or fine-pitch connection lines among the electronic components.

Although the technology herein has been described with reference to particular examples, it is to be understood that these examples are merely illustrative of the principles and applications of the present technology. It is therefore to be understood that numerous modifications may be made and that other arrangements may be devised without departing from the spirit and scope of the present technology as defined by the appended claims.

The invention claimed is:

1. A three-dimensional integrated circuit (IC) packaging structure, comprising:
   a first cavity printed circuit board (PCB) having a first cavity defined on a first surface of the first cavity PCB; and
   a second cavity PCB having a second cavity defined on a second surface of the second cavity PCB, wherein the first cavity PCB is disposed on the second cavity PCB having the first cavity aligned with the second cavity such that a third cavity is defined between the first and the second cavity PCBs.

2. The three-dimensional IC packaging structure of claim 1, wherein the first cavity PCB comprises:
   a core substrate;
   a first group of one or more inner substrates laminated on the core substrate and a second group of one or more inner substrates laminated below the core substrate, wherein the first cavity is formed in the first group of inner substrates such that a surface of the core substrate is exposed; and
   one or more circuit pattern structures formed on the exposed surface of the core substrate in the first cavity.

3. The three-dimensional IC packaging structure of claim 2, further comprising one or more electronic components formed in the third cavity defined between the first and the second cavity PCBs.

4. The three-dimensional IC packaging structure of claim 3, wherein the one or more electronic components is in electrical communications with the one or more circuit pattern structures disposed in the first cavity.

5. The three-dimensional IC packaging structure of claim 2, wherein the first cavity PCB further comprises a conductive pad disposed on a conductive material filling a conductive via.

6. The three-dimensional IC packaging structure of claim 2, wherein the first cavity PCB further comprises a second core substrate disposed above or below the first core substrate.

7. The three-dimensional IC packaging structure of claim 2, wherein the first cavity PCB further comprises a solder mask layer disposed adjacent to the one or more circuit pattern structures.

8. The three-dimensional IC packaging structure of claim 1, further comprising a first group of one or more inner substrates, wherein the third cavity is surrounded by an edge portion of the first group of one or more inner substrates.

9. The three-dimensional integrated circuit (IC) packaging structure of claim 1, wherein edge portions of the first and the second cavity PCB are vertically aligned.

10. The three-dimensional integrated circuit (IC) packaging structure of claim 1, wherein the first cavity PCB has a width greater than a width of the second cavity PCB.

11. The three-dimensional IC packaging structure of claim 1, further comprising one or more electronic components formed on an opposite surface of the first cavity PCB to the first surface of the first cavity PCB where the first cavity is formed.

12. The three-dimensional integrated circuit (IC) packaging structure of claim 1, wherein a portion of the first cavity PCB is embedded into the second cavity PCB.

* * * * *